(12) United States Patent
Zhou et al.

(10) Patent No.: US 12,477,923 B2
(45) Date of Patent: Nov. 18, 2025

(54) DISPLAY PANEL AND DISPLAY EQUIPMENT

(71) Applicant: Hefei Visionox Technology Co., Ltd., Anhui (CN)

(72) Inventors: Qi Zhou, Hefei (CN); Bing Tan, Hefei (CN)

(73) Assignee: HEFEI VISIONOX TECHNOLOGY CO., LTD., Hefei (CN)

(*) Notice: Subject to any disclaimer, the term of this patent is extended or adjusted under 35 U.S.C. 154(b) by 484 days.

(21) Appl. No.: 18/190,471

(22) Filed: Mar. 27, 2023

(65) Prior Publication Data

US 2023/0232692 A1 Jul. 20, 2023

Related U.S. Application Data

(63) Continuation of application No. PCT/CN2021/119846, filed on Sep. 23, 2021.

(30) Foreign Application Priority Data

Dec. 2, 2020 (CN) .......................... 202011391320.6

(51) Int. Cl.
*H10K 59/40* (2023.01)
*H10K 59/80* (2023.01)
*H10K 102/00* (2023.01)

(52) U.S. Cl.
CPC ........... *H10K 59/40* (2023.02); *H10K 59/873* (2023.02); *H10K 2102/311* (2023.02)

(58) Field of Classification Search
None
See application file for complete search history.

(56) References Cited

U.S. PATENT DOCUMENTS

| 11,048,295 B1* | 6/2021 | Smeeton ................. G09F 9/301 |
| 2017/0277288 A1 | 9/2017 | Choi et al. |

(Continued)

FOREIGN PATENT DOCUMENTS

| CN | 106206945 A | 12/2016 |
| CN | 108986671 A | 12/2018 |
| CN | 110021645 A | 7/2019 |

(Continued)

OTHER PUBLICATIONS

International Search Report issued on Dec. 22, 2021 in corresponding application No. PCT/CN2021/119846; 4 pgs.

(Continued)

*Primary Examiner* — Kyoung Lee
(74) *Attorney, Agent, or Firm* — Maier and Maier, PLLC

(57) ABSTRACT

A display panel and a display equipment. The display panel has a bending area and flattening areas located on two sides of the bending area in a length direction of the display panel, and includes: a display structure layer; a first insulating layer located on a side of the display structure layer, the first insulating layer includes a first organic layer and a first inorganic layer that are stacked, the first inorganic layer includes a first body part and at least one first filling parts, structural stiffness of the first filling part is less than that of the first body part, and the first filling part is located in the bending area; and a touch layer located on a side of the first insulating layer away from the encapsulation layer.

20 Claims, 8 Drawing Sheets

(56) References Cited

U.S. PATENT DOCUMENTS

2018/0012549 A1  1/2018  Lee et al.
2020/0194526 A1  6/2020  Zhang

FOREIGN PATENT DOCUMENTS

| CN | 110718646 A | 1/2020 |
| CN | 110727375 A | 1/2020 |
| CN | 110828694 A | 2/2020 |
| CN | 110911451 A | 3/2020 |
| CN | 110943108 A | 3/2020 |
| CN | 111352531 A | 6/2020 |
| CN | 112531130 A | 3/2021 |
| KR | 20160086499 A | 7/2016 |
| KR | 20200012058 A | 2/2020 |
| WO | 2020113650 A1 | 6/2020 |

OTHER PUBLICATIONS

Chinese Office Action issued on Apr. 6, 2022, in corresponding application No. 202011391320.6; 18 pgs.
Chinese Notification to Grant Patent Right for Invention issued on Sep. 28, 2022, in corresponding application No. 202011391320.6; 6 pgs.

\* cited by examiner

DISPLAY PANEL AND DISPLAY EQUIPMENT

CROSS REFERENCE TO RELATED APPLICATION

The present application is a continuation of International Application No. PCT/CN2021/119846 filed on Sep. 23, 2021, which claims the priority to Chinese Patent Application No. 202011391320.6 filed on Dec. 2, 2020, both of which are incorporated herein by reference in their entireties.

TECHNICAL FIELD

The present application relates to the field of display technology, and particularly, to a display panel and a display equipment.

BACKGROUND

Organic Light-Emitting Diode (OLED) is an active light-emitting device. Compared with the traditional Liquid Crystal Display (LCD) display, OLED display does not require backlight and is self-luminous. OLED utilizes a thin film of organic material and a glass substrate, and the organic material will emit light when an electric current flows through it. Therefore, OLED display panels can significantly save electric power, be made lighter and thinner, withstand a wider range of temperature change than LCD display panels and have a larger viewing angle. OLED display panels are expected to become the next generation of flat panel display technology after LCD and are currently one of the most popular technologies in the field of flat panel display technology.

At present, a flexible Active-Matrix Organic Light-Emitting Diode (AMOLED) display panel of that can be bent and folded is the trend of display industry technology and market. With a touch layer matched with a flexible AMOLED display panel, information input can be achieved through fingers, stylus, etc. The touch layer usually includes an organic material layer and a metal layer. The poor matching between the organic material and the metal process leads to a bad touch caused by an open circuit.

SUMMARY

The embodiments of the present application provide a display panel and a display equipment, aiming to solve the problem of poor reliability caused by metal residues in the display panel.

Embodiments of a first aspect of the present application provide a display panel having a bending area and flattening areas located on two sides of the bending area in a length direction of the display panel, wherein the display panel comprises: a display structure layer; a first insulating layer located on a side of the display structure layer, the first insulating layer comprises a first organic layer and a first inorganic layer that are stacked, the first inorganic layer comprises a first body part and at least one first filling parts located in the bending area, structural stiffness of the first filling part is less than structural stiffness of the first body part; and a touch layer located on a side of the first insulating layer away from the display structure layer.

Embodiments of a second aspect of the present application provide a display equipment comprising the above display panel.

In the display panel provided by the embodiments of the present application, the display panel comprises a display structure layer, a first insulating layer and a touch layer. In the first insulating layer, a first inorganic layer and a first organic layer are provided. With the first inorganic layer, the adhesion between the organic layer and the metal layer in the touch layer may be improved while poor adhesion is likely to cause poor function, and the problem of poor reliability caused by metal residues in the touch layer may be alleviated or addressed. The first inorganic layer comprises a first body part and a first filling part, the first filling part has smaller stiffness, and the first filling part is located in the bending area, and the bending and folding performance of the first inorganic layer can be improved by disposing the first filling part, and thus the influence of the first inorganic layer on the bending and folding performance of the display panel is improved, thereby ensuring good bending and folding performance of the display panel. Therefore, the display panel in the embodiments of the present application can alleviate or address the problem of poor reliability caused by metal residues in the display panel, while ensuring good bending and folding performance.

DETAILED DESCRIPTION

At present, a flexible Active-Matrix Organic Light-Emitting Diode (AMOLED) display panel of that can be bent and folded is the trend of display industry technology and market. With a touch layer matched with a flexible AMOLED display panel, information input can be achieved through fingers, stylus, etc. The touch layer usually includes an organic material layer and a metal layer.

Through research, the inventors have found that when the organic layer is in direct contact with the metal layer, separation between the organic layer and the metal layer is likely to occur, causing poor function. Through further studies, it has been found that, in one aspect, due to the strong water absorption of the organic material and the high water content of the organic material, after metal materials such as Al and metal compounds containing Al are formed on the organic material layer, Al is easy to react with water and oxygen to form $Al_2O_3$ and other substances that are not easily etched in the etching process after film formation. In another aspect, some functional groups of organic materials are also easy to react with active metals (such as Al) to form substances that are not easily etched. The above two aspects will lead to substances that are not easily etched remaining on the surface of the organic material layer, resulting in poor adhesion between the organic material layer and the metal material layer, and thus during subsequent use or testing, the organic material layer and the metal material layer are likely to separate from each other, thereby causing poor function.

In order to solve the above-mentioned technical problems, the present application is proposed. In order to better understand the present application, the display panel 10, the display equipment and the method for preparing the display panel 10 according to the embodiments of the present application will be described in detail below with reference to FIGS. 1 to 14.

Figure 1:
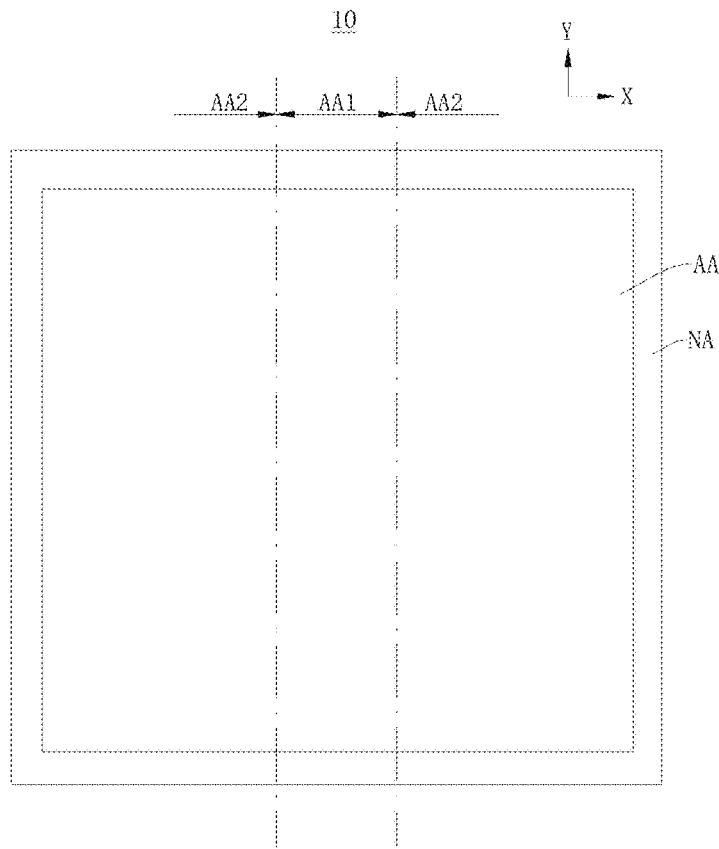
FIG. 1 is a schematic structural diagram of a display panel provided by an embodiment of the first aspect of the present application.

As shown in FIG. 1, the display area AA of the display panel 10 has a bending area AA1 and flattening areas AA2 located on two sides of the bending area AA1 in the length direction (X direction in FIG. 1) of the display panel 10. The display panel 10 can change between the bending state and the flattening state through the bending area AA1. In the bending state, the included angle between the two flattened areas AA2 is less than 180 degrees, and in the flattening state, the included angle between the two flattened areas AA2 is 180 degrees. In FIG. 1, the dividing lines between the flattened areas AA2 and the bending area AA1 are shown by dotted lines, which do not constitute a structural limitation on the display panel 10 in the embodiments of the application.

The display panel 10 further comprises a non-display area NA which may be located on at least one side of the display area AA or on a peripheral side of the display area AA.

Figure 2:
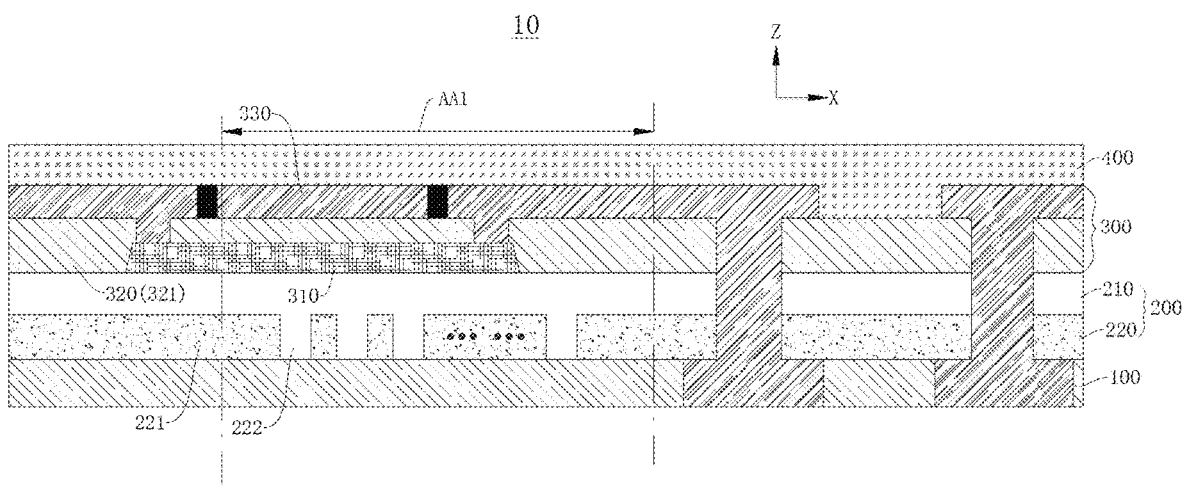
FIG. 2 is a partial cross-sectional view of a display panel provided by an embodiment of the first aspect of the present application.

As shown in FIG. 2, the display panel 10 provided by an embodiment of the present application comprises: a display structure layer 100; a first insulating layer 200 located on a side of the display structure layer 100, and the first insulating layer 200 comprises a first organic layers 210 and a first inorganic layer 220 that are stacked, the first inorganic layer 220 comprises a first body part 221 and a first filling part 222, the structural stiffness of the first filling part 222 is smaller than that of the first body part 221, and the first filling part 222 is located in the bending area AA1; and a touch layer 300 located on a side of the first insulating layer 200 away from the display structure layer 100.

Through research, the inventors have found that the water absorption of inorganic materials is extremely weaker than that of organic materials, the water content of the inorganic material layer is low, and residues such as metal oxides are not easily produced when the metal material layer and the inorganic material layer are in contact with each other. In addition, the problem of the formation of a substance that is not easily etched, which is caused by the interaction between the functional group and the metal material, is not involved in the inorganic material.

The first inorganic layer 220 is disposed in the display panel 10 provided in an embodiment of the present application, and can alleviate or address the problem of poor adhesion between the organic material and the metal material layer in the touch layer 300 which may easily cause poor function, and the problem of poor reliability caused by metal residues in the touch layer 300 can be alleviated or addressed. The bending performance of the first inorganic layer 220 can be improved by disposing the first filling part 222, and thus the influence of the first inorganic layer 220 on the bending performance of the display panel 10 is improved, thereby ensuring good bending performance of the display panel 10. Therefore, the display panel 10 in the embodiments of the present application can alleviate or address the problem of poor reliability caused by metal residues in the display panel 10, while ensuring good bending performance.

The display structure layer 100 further comprises for example a display device layer and an encapsulation layer, and the first insulating layer 200 is located on a side of the encapsulation layer away from the display device layer. Optionally, the display structure layer 100 further comprises a driving device layer located on a side of the display device layer away from the encapsulation layer. The driving device layer comprises for example a driving circuit for driving the display panel 10 to display. Optionally, the driving circuit comprises a thin film transistor, a scanning circuit, a data circuit and the like. Optionally, the display device layer comprises a first electrode, a light emitting structure layer and a second electrode, and the light emitting structure layer comprises a pixel definition layer, a pixel opening disposed in the pixel definition layer, and a light emitting structure located in the pixel opening. Optionally, the encapsulation layer comprises an organic layer and an inorganic layer that are stacked.

The first insulating layer 200 may also extend from the display area AA to the non-display area NA. The touch layer 300 may extend from the display area AA to the non-display area NA, and the metal layer in the touch layer 300 is connected to the metal layer of the display structure layer 100 in the non-display area NA, so that the metal layer in the touch layer 300 is electrically connected with the external device through the metal layer in the display structure layer 100 and transmits information.

The number of first filling part 222 of the first inorganic layer 220 is not limited. Multiples first filling parts 222 may be disposed and distributed at intervals along the length direction. Such distribution can further improve the flexibility of the display panel 10 and improve the bending and folding performance of the display panel 10.

The spacing between two adjacent first filling parts 222 in the length direction can be from 1 μm to 10 μm. When the spacing between the two adjacent first filling parts 222 is within the above range, it can not only prevent the distance between the two adjacent first filling parts 222 from being too far while a too far distance will lead to a too large size of the first body part 221 and affect the bending and folding performance of the display panel 10, but also prevent the spacing between the two adjacent first filling parts 222 from being too small while a too small distance may lead to insufficient structural stiffness and easy damage of parts of the display panel 10 in the bending area AA1. In order to show the structure of the first inorganic layer 220 more clearly, a portion of the first filling part 222 is omitted in FIG. 2.

The first filling part 222 may have a size of from 1 μm to 10 μm in the length direction. When the size of the first filling part 222 is within the above range, it can not only prevent the size of the first filling part 222 in the length direction from being too small while a too small size of the first filling part 222 in the length direction will lead to a too large size of the first body part 221 and affect the bending and folding performance of the display panel 10, but also prevent the size of the first filling part 222 extended in the length direction from being too large while a too large size of the first filling part 222 extended in the length direction may lead to insufficient structural stiffness and easy damage of parts of the display panel 10 in the bending area AA1.

Figure 3:
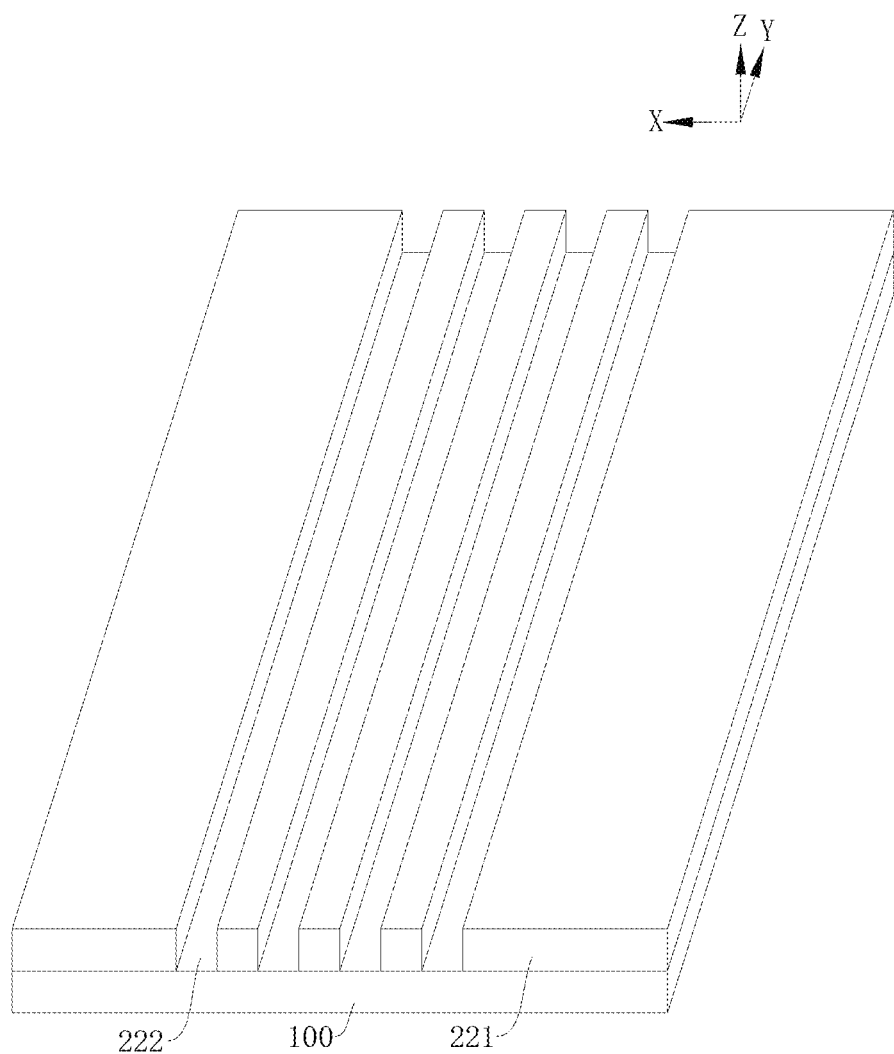
FIG. 3 is a schematic diagram of a partial layer structure of a display panel provided by an embodiment of the first aspect of the present application.

Please refer to FIG. 3. In order to show the structure of the first inorganic layer 220 more clearly, only the first inorganic layer 220 and the display structure layer 100 are shown in FIG. 3.

In the provided display panel 10 according to the embodiment of the present application, the first filling part 222 is formed in a way of extending along the width direction (Y direction in FIG. 3), which can improve the structural stiffness of the display panel 10 in the width direction.

The first filling part 222 is disposed through the first inorganic layer 220 along the width direction, which further reduces the structural stiffness of the display panel 10 in the length direction, improves the bending and folding performance of the display panel 10, and facilitates the display panel 10 to change between a bending state and a flattening state.

There are various sizes of the first filling part 222 in the thickness direction. Referring to FIG. 2, the first filling part 222 is disposed through the first inorganic layer 220 in the thickness direction, which can further reduce the structural stiffness of the display panel 10 in the length direction, improve the bending and folding performance of the display panel 10, and facilitate the display panel 10 to change between a bending state and a flattening state.

Figure 4:
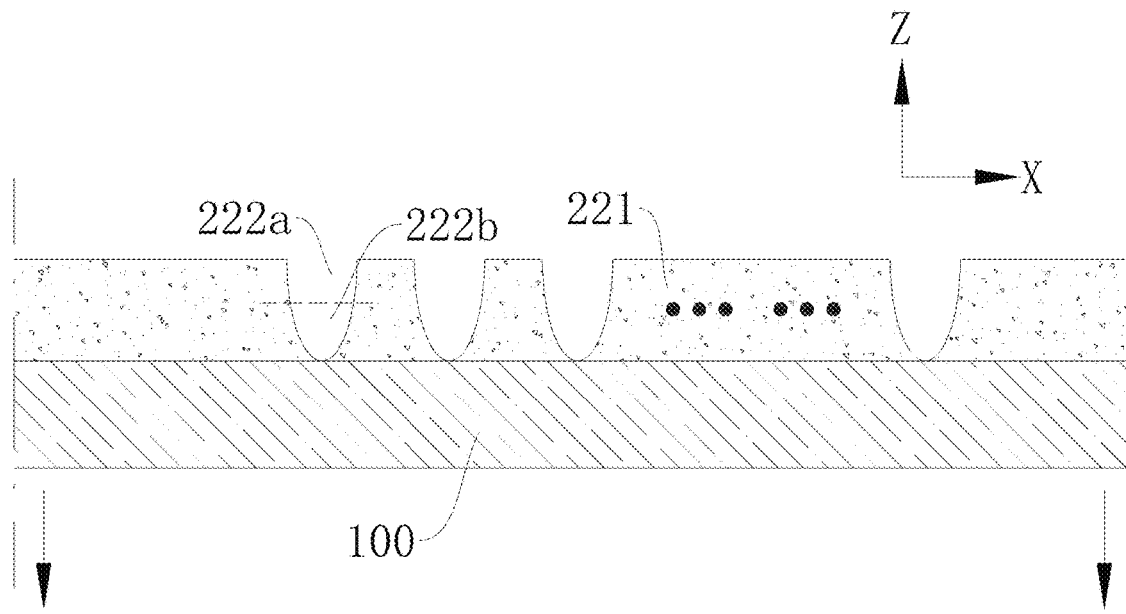
FIG. 4 is a cross-sectional view of a partial layer structure of a display panel provided by an embodiment of the first aspect of the present application.
Figure 5:
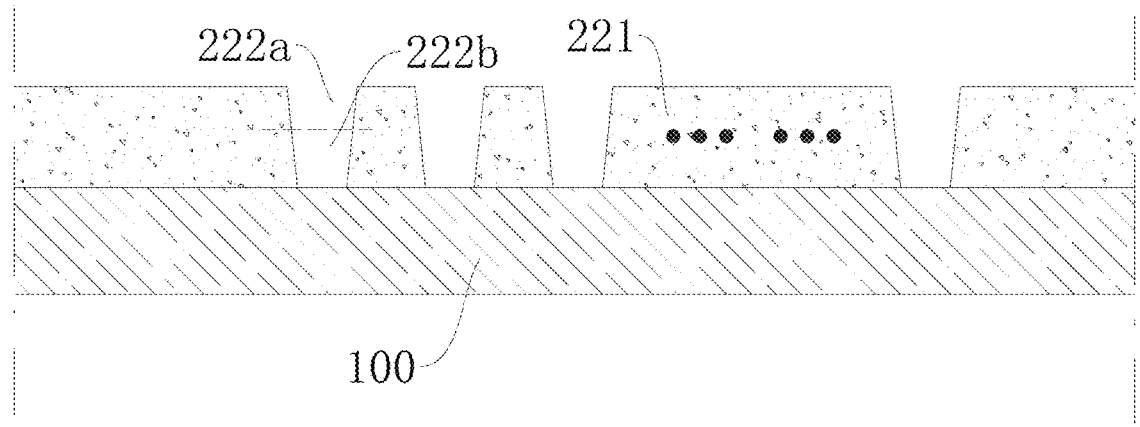
FIG. 5 is a cross-sectional view of a partial layer structure of a display panel provided by another embodiment of the first aspect of the present application.

As shown in FIG. 4 and FIG. 5, in the display panel 10 provided by the embodiment of the present application, the cross-sectional shape of the first filling part 222 is at least one of rectangle, trapezoid, semicircle and a combination thereof. The cross-sectional shape of the first filling part 222 is the cross-section of the first filling part 222 on the plane where the thickness direction (Z direction in FIG. 4) and the length direction are located.

Optionally, the cross-section of the first filling part 222 is inconsistent in size in the thickness direction. For example, the first filling part 222 has a first subpart 222*a* and a second subpart 222*b* distributed in the thickness direction, and the size of the first subpart 222*a* in the length direction is larger than that of the second subpart 222*b* in the length direction. As a result, when the display panel 10 forms a bending opening in the bending state, the first subpart 222*a* is located at a side of the second subpart 222*b* away from the bending opening in the bending state. That is, in the viewing direction shown in FIG. 4, when two ends of the display panel 10 in the length direction are bent downward along the direction indicated by two arrows, the first subpart 222*a* is located at a side of the second subpart 222*b* away from the display structure layer 100. FIG. 4 and FIG. 5 show the boundary line between the first subpart 222*a* and the second subpart 222*b* of one of the first filling parts 222 with a dotted line which does not constitute a structural limitation on the display panel 10 of the embodiment of the present application.

In these optional embodiments, the size of the first subpart 222*a* in the length direction is larger than the size of the second subpart 222*b* in the length direction, and the first subpart 222*a* has better flexibility. In the bending state, the first subpart 222*a* is located at a side of the second subpart 222*b* away from the bending opening, which can further improve the bending and folding performance of the display panel 10.

The positions of the first inorganic layer 220 and the first organic layer 210 are not limited. For example, the first inorganic layer 220 may be disposed on a side of the first organic layer 210 facing the encapsulation layer. Then the material of the first filling part 222 may be the same as that of the first organic layer 210.

In these optional embodiments, during the molding process of the display panel 10, an inorganic material layer may be formed on the encapsulation layer, and the organic material layer may be patterned to form the first body part 221 and the first opening. The position of the first opening is the same as the position of the first filling part 222. The organic material is further applied on the inorganic material layer, at least part of the organic material enters the first opening to form the first filling part 222, and the other part forms the first organic layer 210. Therefore, when the material of the first filling part 222 is the same as that of the first organic layer 210, there is no need to add a separate process for forming the first filling part 222, which can simplify the molding process of the display panel 10 and improve the molding efficiency of the display panel 10.

Optionally, the material of the first organic layer 210 includes one or more of polyimide, polyacrylate, polyetherimide, polyethylene terephthalate, polyethylene naphthalate kind. The material of the first filling part 222 may be one or more of polyimide, polyacrylate, polyetherimide, polyethylene terephthalate, and polyethylene naphthalate. The material of the first inorganic layer 220 may be one or more of silicon nitride, silicon oxide, and silicon oxynitride.

As shown in FIG. 2, the touch layer 300 comprises a first metal layer 310, a second insulating layer 320 and a second metal layer 330 located on a side of the first metal layer 310 away from the first insulating layer 200. The second insulating layer 320 is located between the first metal layer 310 and the second metal layer 330 and comprises a second organic layer 321.

Figure 6:
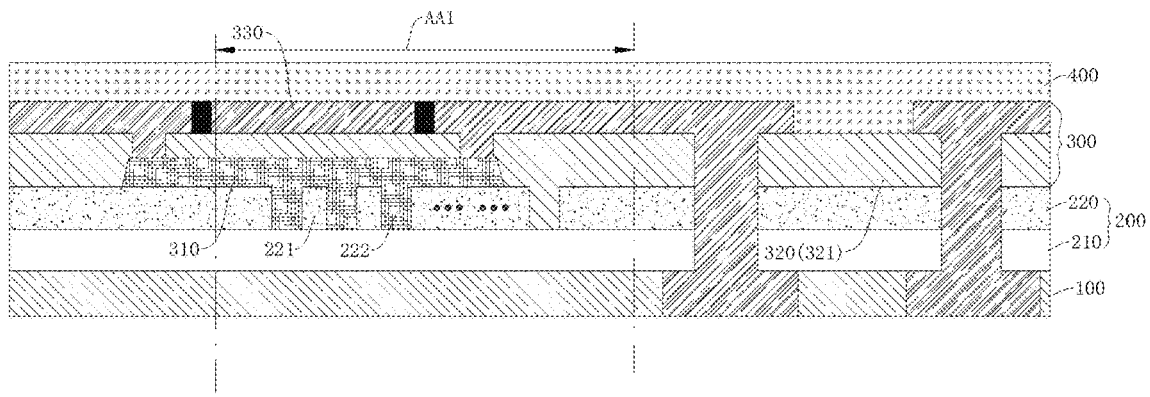
FIG. 6 is a cross-sectional view of a display panel provided by another embodiment of the first aspect of the present application.

As shown in FIG. 6, the first inorganic layer 220 may be disposed on the side of the first organic layer 210 facing the touch layer 300, and the material of the first filling part 222 may be the metal material of the first metal layer 310 and/or the insulating material of the second insulating layer 320.

When the first inorganic layer 220 is located on the side of the first organic layer 210 facing the touch layer 300, during the molding process of the display panel 10, an inorganic material layer can be formed on the first organic layer 210, and the inorganic material layer can be patterned to form the first body part 221 and the first opening. Then a first metal layer 310 and a first insulating layer 200 is formed on the inorganic material layer. When the distribution area of the first metal layer 310 is large and the first metal layer 310 can cover at least part of the first opening, at least part of the material of the first metal layer 310 enters the first opening to form the first filling part 222. When the first metal layer 310 is a bridging metal layer, the distribution area of the first metal layer 310 is small and the first metal layer 310 does not cover the first opening or does not completely cover all the first openings, at least part of the material of the first insulating layer 200 enters the first opening to form the first filling part 222.

The material of the first metal layer 310 and the material of the second metal layer 320 may be one or more of Ti, Al, Mo, Ag, Cu, and Ni. When at least a portion of the first filling part 222 is formed of metal material, the material of the first filling part 222 may be one or more of Ti, Al, Mo, Ag, Cu, and Ni.

An organic material layer may also be provided in the touch layer 300 to avoid generation of metal residues.

Figure 7:
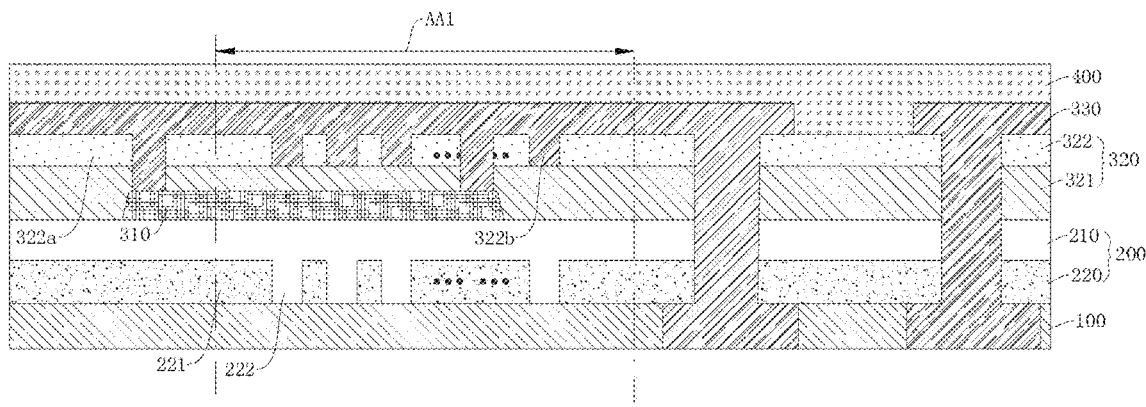
FIG. 7 is a cross-sectional view of a display panel provided by yet another embodiment of the first aspect of the present application.

As shown in FIG. 7, the second insulating layer 320 includes a second inorganic layer 322. The second inorganic layer 322 comprises a second body part 322a and a second filling part 322b. The structural stiffness of the second filling part 322b is smaller than that of the second body part 322a. The second filling part 322b is located in the bending area AA1.

In these optional embodiments, the compatibility between the second organic layer 321, the first metal layer 310, and the second metal layer 330 can be improved by disposing the second inorganic layer 322, thus avoiding the poor function caused by metal residues produced on the contact surfaces of the second organic layer 321 and the first metal layer 310 and/or the second metal layer 330. In addition, the second filling part 322b with low structural stiffness is disposed on the second inorganic layer 322, which can ensure good bending and folding performance of the display panel 10.

Figure 8:
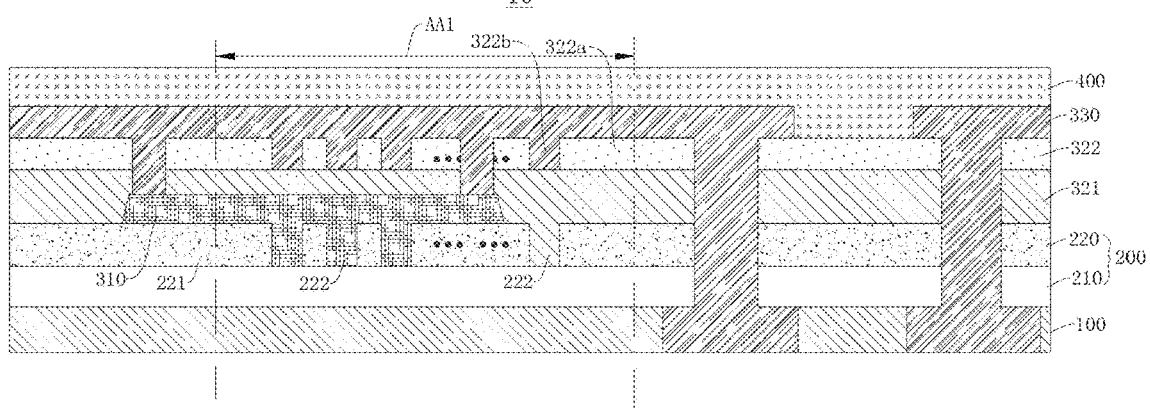
FIG. 8 is a cross-sectional view of a display panel provided by still another embodiment of the first aspect of the present application.

There are many ways to dispose the relative positions of the second inorganic layer 322 and the second organic layer 321. As shown in FIG. 8, the second inorganic layer 322 may be disposed on a side of the second organic layer 321 close to the second metal layer 330. Alternatively, in other embodiments, the second inorganic layer 322 may be disposed on a side of the second organic layer 321 close to the first metal layer 310.

When the first inorganic layer 220 is located on a side of the first organic layer 210 close to the touch layer 300, a separate process step may be used to form the first filling part 222 on the first inorganic layer 220.

Figure 9:
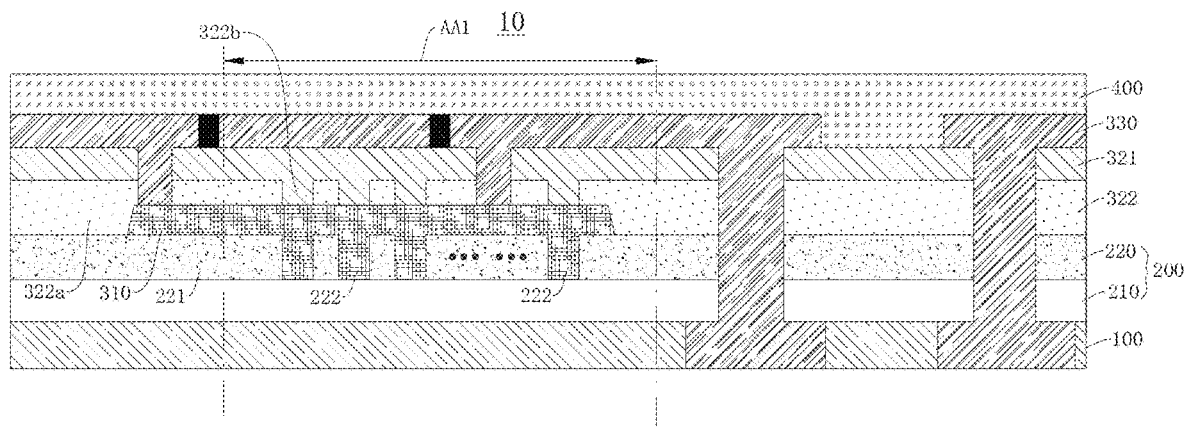
FIG. 9 is a cross-sectional view of a display panel provided by still yet another embodiment of the first aspect of the present application.
Figure 10:
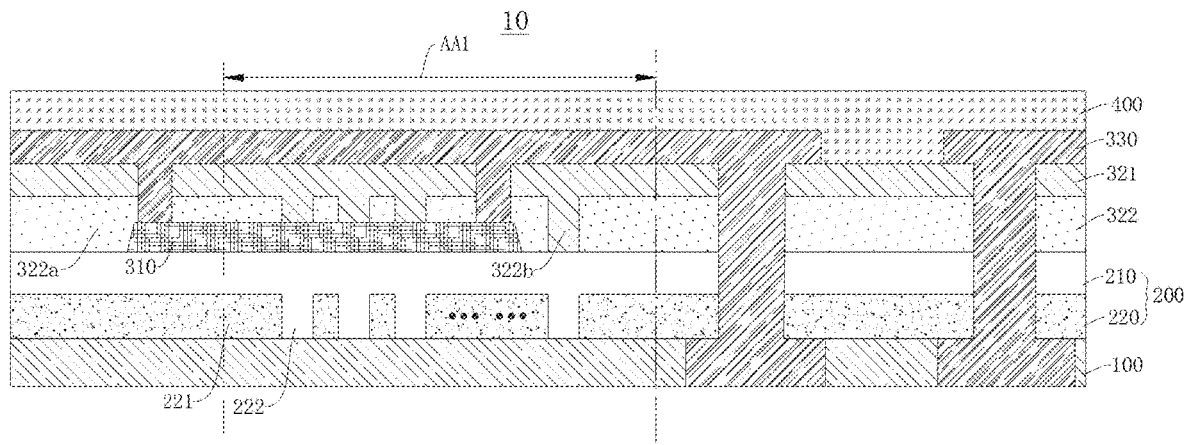
FIG. 10 is a cross-sectional view of a display panel provided by still yet another embodiment of the first aspect of the present application.

Referring to FIG. 9 and FIG. 10, when the distribution area of the first metal layer 310 is large enough to completely cover the first opening of the first inorganic layer 220, at least part of the material of the first metal layer 310 can be used to form the first filling part 222.

When the distribution area of the first metal layer 310 is small and does not cover the first opening or cannot completely cover the first opening on the first inorganic layer 220, the second inorganic layer 322 is located on the second organic layer 321 away from the first metal layer 310. As a result, at least a portion of the material of the second organic layer 321 forms the second filling part 322b, and the first organic layer 210 forms the first filling part 222.

The number of the second filling part 322b is not limited. Multiples second filling parts 322b may be disposed and distributed at intervals along the length direction, which can further improve the flexibility of the display panel 10 and improve the bending and folding performance of the display panel 10.

The spacing between two adjacent second filling parts 322b in the length direction can be for example from 1 μm to 10 μm. When the spacing between the two adjacent second filling parts 322b is within the above range, it can not only prevent the distance between the two adjacent second filling parts 322b from being too far while a too far distance will lead to a too large size of the second body part 322a and affect the bending and folding performance of the display panel 10, but also prevent the spacing between the two adjacent second filling parts 322b from being too small while a too small distance may lead to insufficient structural stiffness and easy damage of parts of the display panel 10 in the bending area AA1.

Optionally, the second filling part 322b may have a size of from 1 μm to 10 μm in the length direction. When the size of the second filling part 322b in the length direction is within the above range, it can not only prevent the size of the second filling part 322b in the length direction from being too small while a too small size of the second filling part 322b will lead to a too large size of the second body part 322a and affect the bending and folding performance of the display panel 10, but also prevent the size of the second filling part 322b in the length direction from being too large while a too large size of the second filling part 322b in the length direction may lead to insufficient structural stiffness and easy damage of parts of the display panel 10 in the bending area AA1.

The second filling part 322b is formed in a way of extending along the width direction, which can improve the structural stiffness of the display panel 10 in the width direction. Optionally, the second filling part 322b is disposed through the second inorganic layer 322 along the width direction, which can further reduce the structural stiffness of the display panel 10 in the length direction, improve the bending and folding performance of the display panel 10, and facilitate the display panel 10 to change between a bending state and a flattening state.

There are various sizes of the second filling part 322b in the thickness direction. For example, the second filling part 322b is disposed through the second inorganic layer 322 in the thickness direction, which can further reduce the structural stiffness of the display panel 10 in the length direction, improve the bending and folding performance of the display panel 10, and facilitate the display panel 10 to change between a bending state and a flattening state.

Optionally, the cross-sectional shape of the second filling part 322b is at least one of rectangle, trapezoid, semicircle and a combination thereof. The cross-sectional shape of the second filling part 322b is the cross-section of the second filling part 322b on the plane where the thickness direction and the length direction are located.

Optionally, the cross-section of the second filling part 322b is inconsistent in size in the thickness direction. For example, the second filling part 322b has a third subpart (not shown) and a fourth subpart (not shown) distributed in the thickness direction, and the size of the third subpart in the length direction is larger than that of the fourth subpart in the length direction. As a result, when the display panel 10 forms a bending opening in the bending state, the third subpart is located at a side of the fourth subpart away from the bending opening in the bending state.

In these optional embodiments, the size of the third subpart in the length direction is larger than the size of the fourth subpart in the length direction, and the third subpart has better flexibility. In the bending state, the third subpart is located at a side of the fourth subpart away from the bending opening, which can further improve the bending and folding performance of the display panel 10.

In some embodiments, the display panel 10 further comprises, for example, a protective layer 400 disposed on a side of the touch layer 300 away from the first insulating layer 200. The protective layer 400 is used to provide protection to the touch layer 300. Optionally, the protective layer 400 is made of an organic material, which can improve the bending and folding performance of the display panel 10.

Embodiments of the second aspect of the present application provide a display equipment comprising the display panel 10 of any one of the above-mentioned first aspects. Since the display equipment of embodiments of the present application comprises the above-mentioned display panel 10, the display equipment of embodiments of the present application has the beneficial effects of the above-mentioned display panel 10, which will not be repeated here.

The display equipment in the embodiments of the present application includes but is not limited to a mobile phone, a personal digital assistant (PDA), a tablet computer, an e-book, a television, an access control, a smart fixed phone, a console and other devices with display functions.

Figure 11:
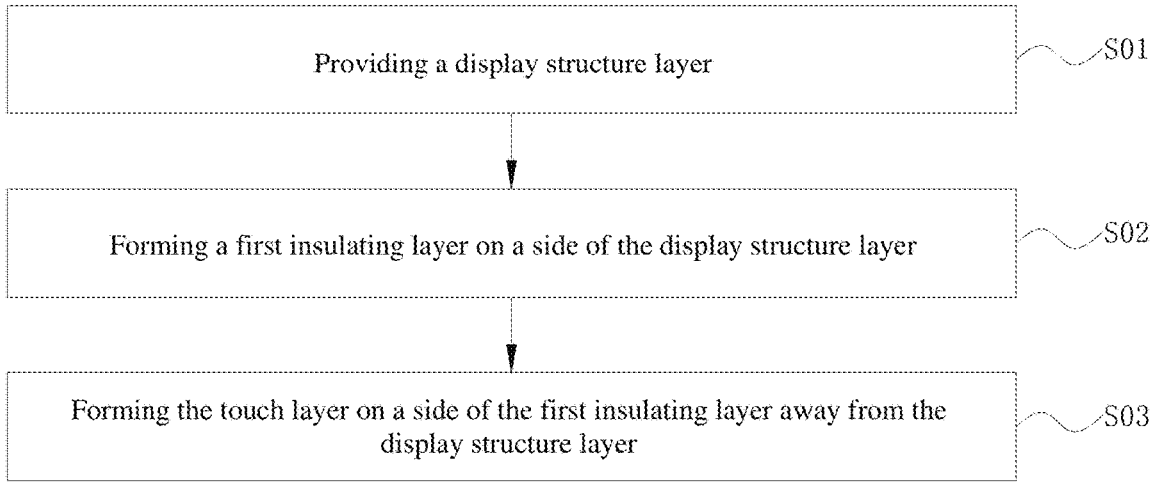
FIG. 11 is a schematic flowchart of a method for preparing a display panel provided in an embodiment of the second aspect of the present application.

Please refer to FIG. 11 together. The method for preparing the display panel 10 provided by embodiments of the third aspect of the present application comprises:

Step S01: providing a display structure layer 100.

The display structure layer 100 comprises, for example, a display device layer and an encapsulation layer.

Step S02: forming a first insulating layer 200 on a side of the display structure layer 100.

When the display structure layer 100 comprises, for example, a display device layer and an encapsulation layer, the first insulating layer 200 is formed on a side of the encapsulation layer away from the display device layer.

The first insulating layer 200 may comprise a first organic layer 210 and a first inorganic layer 220 that are stacked. The first inorganic layer 220 may comprise a first body part 221 and a first filling part 222. The structural stiffness of the first filling part 222 may be smaller than that of the first body part 221. The first filling part 222 may be located in the bending area AA1.

Step S03: forming the touch layer 300 on a side of the first insulating layer 200 away from the display structure layer 100.

In the display panel 10 prepared in the embodiments of the present application, in the first insulating layer 200, a first inorganic layer 220 and a first organic layer 210 are provided. With the first inorganic layer 220, the adhesion between the organic material and the metal layer in the touch layer 300 may be improved while poor adhesion is likely to cause poor function, and the problem of poor reliability caused by metal residues in the touch layer 300 may be alleviated or addressed. The first inorganic layer 220 comprises a first body part 221 and a first filling part 222, the first filling part 222 has smaller stiffness, and the first filling part 222 is located in the bending area AA1, and the bending and folding performance of the first inorganic layer 220 can be improved by disposing the first filling part 222, and thus the influence of the first inorganic layer 220 on the bending and folding performance of the display panel 10 is improved, thereby ensuring good bending and folding performance of the display panel 10. Therefore, the display panel 10 in the embodiments of the present application can alleviate or address the problem of poor reliability caused by metal residues in the display panel 10, while ensuring good bending performance.

Figure 12:
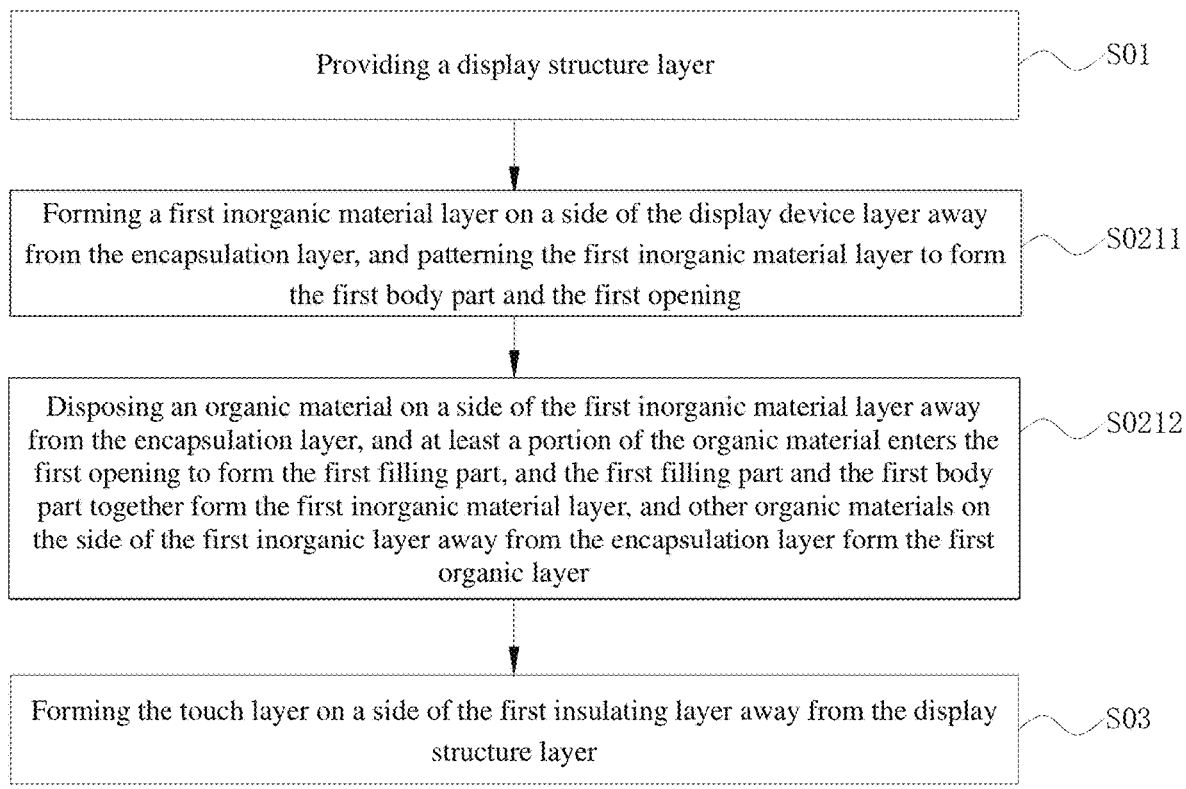
FIG. 12 is a schematic flowchart of a method for preparing a display panel provided in another embodiment of the second aspect of the present application.

Please refer to FIG. 12 together. There are many ways to set step S02. In some optional embodiments, the first inorganic layer 220 is located on a side of the first organic layer 210 facing the encapsulation layer. Step S02 includes:

Step S0211: forming a first inorganic material layer on a side of the display device layer away from the encapsulation layer, and patterning the first inorganic material layer to form the first body part 221 and the first opening.

Step S0212: disposing an organic material on a side of the first inorganic material layer away from the encapsulation layer, and at least a portion of the organic material enters the first opening to form the first filling part 222, and the first filling part 222 and the first body part 221 together form the first inorganic material layer 220, and other organic materials on the side of the first inorganic layer 220 away from the encapsulation layer form the first organic layer 210.

In some other embodiments, the first inorganic layer 220 is located on a side of the first organic layer 210 away from the encapsulation layer, the touch layer 300 comprises a first metal layer 310, a second insulating layer 320 located on a side of the first metal layer 310 away from the first inorganic layer 220, and a second metal layer 330 located on a side of the second insulating layer 320 away from the first metal layer 310.

Figure 13:
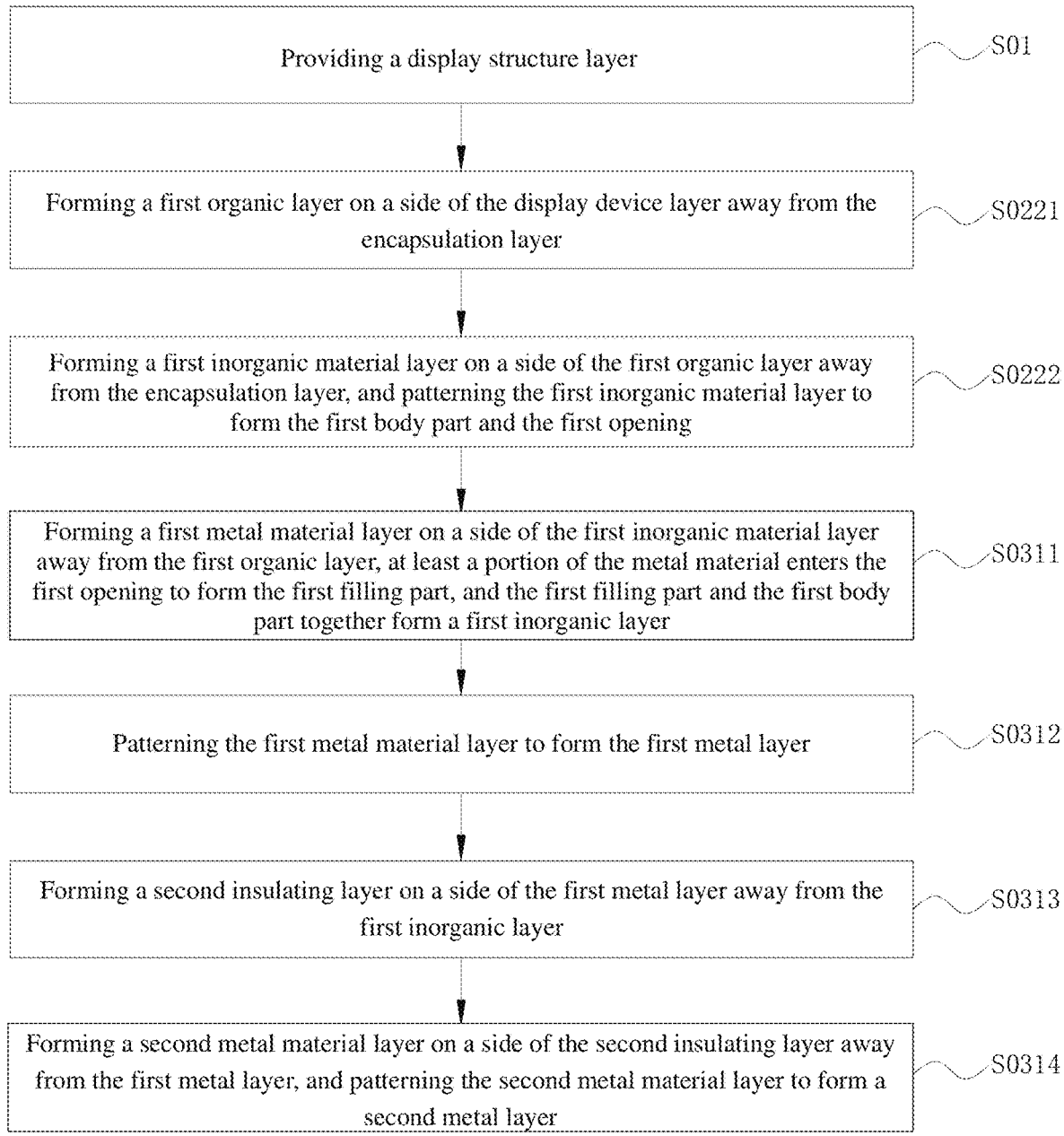
FIG. 13 is a schematic flowchart of a method for preparing a display panel provided in yet another embodiment of the second aspect of the present application.

Please also refer to FIG. 13. The distribution area of the first metal layer 310 is relatively large and the orthographic projection on the first inorganic layer 220 covers all the first filling parts 222. Then step S02 comprises:

Step S0221: forming a first organic layer 210 on a side of the display device layer away from the encapsulation layer;

Step S0222: forming a first inorganic material layer on a side of the first organic layer 210 away from the encapsulation layer, and patterning the first inorganic material layer to form the first body part 221 and the first opening.

Step S03 comprises:

Step S0311: forming a first metal material layer on a side of the first inorganic material layer away from the first organic layer 210, at least a portion of the metal material enters the first opening to form the first filling part 222, and the first filling part 222 and the first body part 221 together form a first inorganic layer 220.

Step S0312: patterning the first metal material layer to form the first metal layer 310.

Step S0313: forming a second insulating layer 320 on a side of the first metal layer 310 away from the first inorganic layer 220.

Step S0314: forming a second metal material layer on a side of the second insulating layer 320 away from the first metal layer 310, and patterning the second metal material layer to form a second metal layer 330.

Figure 14:
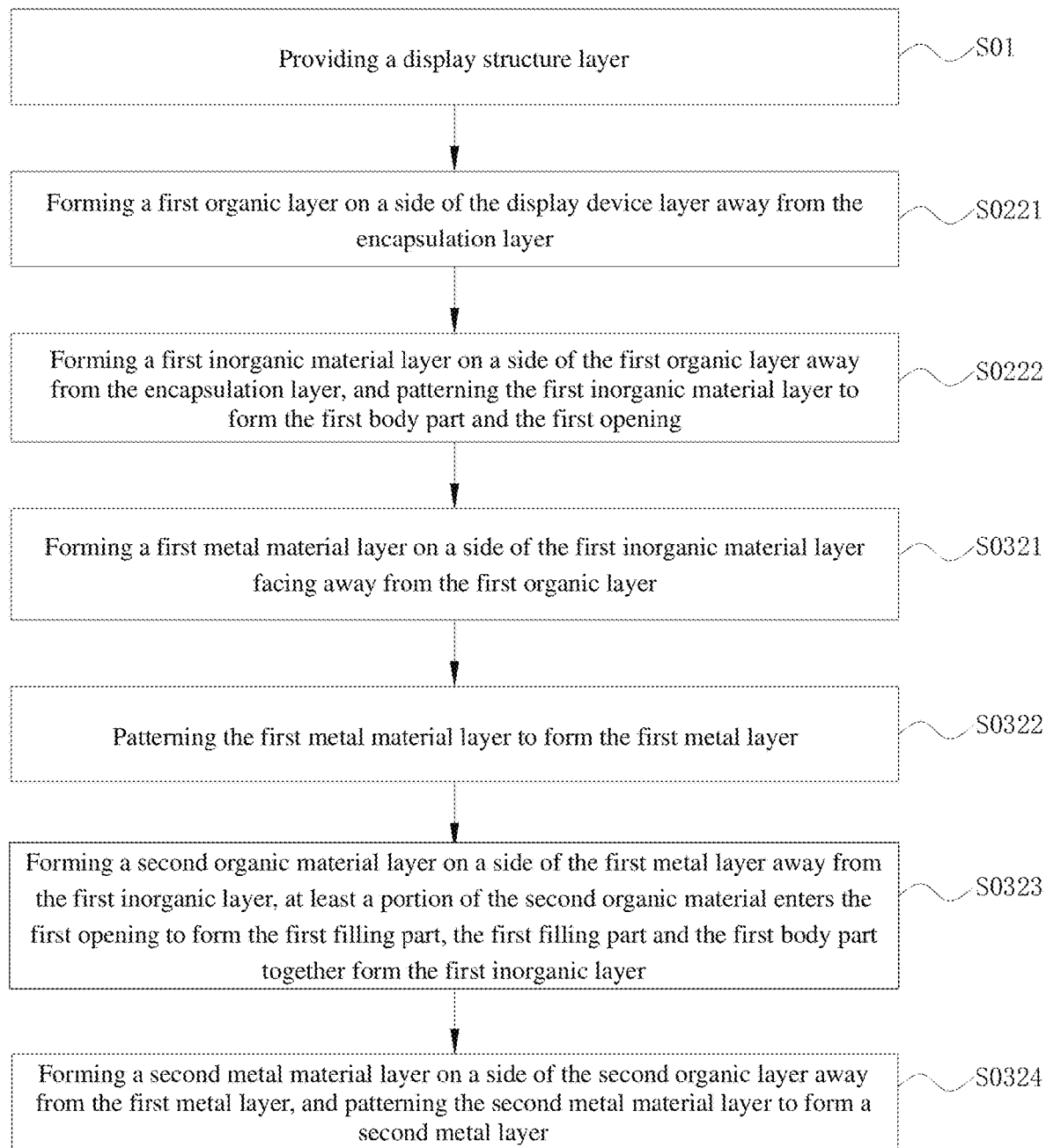
FIG. 14 is a schematic flowchart of a method for preparing a display panel provided in yet another embodiment of the second aspect of the present application.

Please also refer to FIG. 14. The distribution area of the first metal layer 310 is relatively small and the orthographic projection on the first inorganic layer 220 does not cover or not completely cover the first filling part 222. The second insulating layer 320 comprises a second organic layer 321. Then step S03 comprises:

Step S0321: forming a first metal material layer on a side of the first inorganic material layer facing away from the first organic layer 210.

Optionally, when the orthographic projection of the first metal layer 310 on the first inorganic layer 220 does not completely cover the first filling part 222, at least a portion of the metal material enters the first opening to form a portion of the first filling part 222.

Step S0322: patterning the first metal material layer to form the first metal layer 310;

Step S0323: forming a second organic material layer on a side of the first metal layer 310 away from the first inorganic layer 220, at least a portion of the second organic material enters the first opening to form the first filling part 222, the first filling part 222 and the first body part 221 together form the first inorganic layer 220.

Optionally, when the orthographic projection of the first metal layer 310 on the first inorganic layer 220 does not completely cover the first filling part 222, at least a portion of the second organic material enters the first opening to form another portion of the first filling part 222. Part of the materials of the first filling part 222 is a metal material and is the same as the material of the first metal layer 310, and another part of the materials of the first filling part 222 is an organic material and is the same as the material of the second organic material.

Step S0324: forming a second metal material layer on a side of the second organic layer 321 away from the first metal layer 310, and patterning the second metal material layer to form a second metal layer 330.

In still some optional embodiments, the second insulating layer 320 further comprises a second inorganic layer 322, and the second inorganic layer 322 comprises a second body part 322a and a second filling part 322b. The second inorganic layer 322 is disposed on a side of the second organic layer 321 away from the first metal layer 310.

For example, after step S0323, steps of forming a second inorganic material layer on the second organic layer 321, and patterning the second inorganic material layer to form the second body part 322a and the second opening may be also included. In step S0324, a second metal material layer is formed on a side of the second organic layer 321 away from the first metal layer 310, at least a portion of the metal material enters the second opening to form a second filling part 322b, and the second metal material layer is patterned to form the second metal layer 330.

In some optional embodiments, the second inorganic layer 322 is disposed on a side of the second organic layer 321 facing the first metal layer 310. Then after step S0222, it also includes: forming a filling material layer on the first inorganic material layer, patterning the filling material layer so that the filling material enters the first opening to form the first filling part 222.

Before step S0323, it may also include forming a second inorganic material layer on the first metal layer 310, and patterning the second inorganic material layer to form the second body part 322a and the second opening. In step S0323, a second organic material layer is formed on the side of the second inorganic layer 322 away from the first metal layer 310, and at least part of the second organic material enters the second opening to form a second filling part 322b, and the second filling part 322b and the second filling part 322a together form the second inorganic layer 322.

What is claimed is:

1. A display panel, having a bending area and flattening areas located on two sides of the bending area in a length direction of the display panel, the display panel comprising:
   a display structure layer;
   a first insulating layer located on a side of the display structure layer, the first insulating layer comprising a first organic layer and a first inorganic layer that are stacked, the first inorganic layer comprising a first body part, and at least one first filling parts located in the bending area, structural stiffness of the first filling part being less than structural stiffness of the first body part; and
   a touch layer located on a side of the first insulating layer away from the display structure layer.

2. The display panel according to claim 1, wherein multiple of the at least one first filling parts are distributed at intervals along the length direction.

3. The display panel according to claim 2, wherein a spacing between two adjacent first filling parts is from 1 μm to 10 μm.

4. The display panel according to claim 2, wherein a size of the first filling part in the length direction is from 1 μm to 10 μm.

5. The display panel according to claim 1, wherein cross-sectional shape of the first filling part is at least one of rectangle, trapezoid, semicircle and a combination thereof.

6. The display panel according to claim 1, wherein
   the first filling part is disposed through the first inorganic layer along thickness direction of the display panel; and/or
   the first filling part is disposed through the first inorganic layer in width direction of the display panel.

7. The display panel according to claim 1, wherein the first inorganic layer is located on a side of the first organic layer facing the display structure layer.

8. The display panel according to claim 7, wherein a material of the first filling part is the same as a material of the first organic layer.

9. The display panel according to claim 1, wherein the first inorganic layer is located on a side of the first organic layer facing the touch layer.

10. The display panel according to claim 9, wherein a material of the first filling part comprises a metal material and/or an insulating material.

11. The display panel according to claim 1, wherein the touch layer comprises: a first metal layer, a second insulating layer, and a second metal layer located on a side of the first metal layer away from the first insulating layer; and the second insulating layer is located between the first metal layer and the second metal layer and comprises a second organic layer.

12. The display panel according to claim 11, wherein the second insulating layer further comprises: a second inorganic layer, the second inorganic layer comprises a second body part and a second filling part, and structural stiffness of the second filling part is smaller than that of the second body part, and the second filling part is located in the bending area.

13. The display panel according to claim 12, wherein multiple of the second filling parts are distributed at intervals along the length direction.

14. The display panel according to claim 12, wherein a spacing between two adjacent second filling parts is from 1 μm to 10 μm.

15. The display panel according to claim 12, wherein the second filling part is disposed through the second inorganic layer along thickness direction of the display panel; and/or
   the second filling part is disposed through the second inorganic layer in width direction of the display panel.

16. The display panel according to claim 12, wherein a size of the second filling part extending in the length direction is from 1 μm to 10 μm.

17. The display panel according to claim 12, wherein cross-sectional shape of the second filling part on a plane perpendicular to thickness direction of the display panel is at least one of rectangle, trapezoid, semicircle and a combination thereof.

18. The display panel according to claim 12, wherein the second inorganic layer is located on a side of the second organic layer facing the first metal layer, or the second inorganic layer is located on a side of the second organic layer away from the first metal layer.

19. The display panel according to claim 12, wherein a material of the second filling part is the same as a material of the second metal layer.

20. A display equipment, comprising the display panel according to claim 1.

* * * * *